United States Patent
Okita et al.

(10) Patent No.: US 7,283,305 B2
(45) Date of Patent: Oct. 16, 2007

(54) SOLID STATE IMAGE PICKUP DEVICE, METHOD FOR PRODUCING THE SAME, AND IMAGE PICKUP SYSTEM COMPRISING THE SOLID STATE IMAGE PICKUP DEVICE

(75) Inventors: Akira Okita, Kanagawa (JP); Hiroki Hiyama, Kanagawa (JP); Hideaki Takada, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 442 days.

(21) Appl. No.: 10/991,396

(22) Filed: Nov. 19, 2004

(65) Prior Publication Data

US 2005/0122418 A1    Jun. 9, 2005

(30) Foreign Application Priority Data

Dec. 3, 2003    (JP)    .............................. 2003-404544

(51) Int. Cl.
G02B 27/10    (2006.01)
(52) U.S. Cl. ...................................................... 359/619
(58) Field of Classification Search ................ 356/620; 359/619, 620, 621, 622, 623, 642
See application file for complete search history.

(56) References Cited

U.S. PATENT DOCUMENTS

| | | | | |
|---|---|---|---|---|
| 5,239,412 A * | 8/1993 | Naka et al. | .................. | 359/619 |
| 5,514,888 A | 5/1996 | Sano et al. | .................. | 257/232 |
| 5,561,317 A | 10/1996 | Momma et al. | ............ | 257/620 |
| 5,731,131 A | 3/1998 | Momma et al. | ............ | 430/311 |
| 6,188,094 B1 * | 2/2001 | Kochi et al. | .................. | 257/232 |
| 6,605,850 B1 | 8/2003 | Kochi et al. | .................. | 257/431 |
| 6,670,990 B1 | 12/2003 | Kochi et al. | ................. | 348/310 |
| 6,995,800 B2 * | 2/2006 | Takahashi et al. | ........... | 348/340 |
| 2003/0164887 A1 | 9/2003 | Koizumi et al. | ............ | 348/308 |
| 2003/0179457 A1 | 9/2003 | Dobashi et al. | ............. | 359/619 |
| 2003/0218117 A1 | 11/2003 | Hiyama et al. | ........... | 250/208.1 |
| 2004/0065808 A1 | 4/2004 | Kochi et al. | .............. | 250/214.1 |
| 2004/0105022 A1 * | 6/2004 | Hirayama et al. | ........... | 348/272 |

FOREIGN PATENT DOCUMENTS

| | | |
|---|---|---|
| JP | 8 321 595 A | 12/1996 |
| JP | 2003-209230 A | 7/2003 |
| JP | 2003-243639 A | 8/2003 |

\* cited by examiner

*Primary Examiner*—Roy M. Punnoose
(74) *Attorney, Agent, or Firm*—Fitzpatrick, Cella, Harper & Scinto

(57) ABSTRACT

The present invention inhibits variations in sensitivity of an image pickup element formed in a jointed area in the image pickup element produced using exposure in a joined fashion.

The image pickup element 11 has a light receiving area 102 formed on a substrate 101, an insulation layer 104 deposited on a light receiving area 102, and a microlens 106 formed on the insulation layer 104 and collecting incident light onto the light receiving area 102. A pattern 103L and a pattern 103R with an optical axis of the microlens 106 as a divisional line by exposure in a joined fashion in different exposure steps are arranged with an optical path for incident light collected by the microlens 106 held therebetween, and are provided so that a clearance from the optical path equals a distance L. The distance L is set to be larger than the alignment accuracy of an exposure device exposing the patterns 103L and 103R.

5 Claims, 15 Drawing Sheets

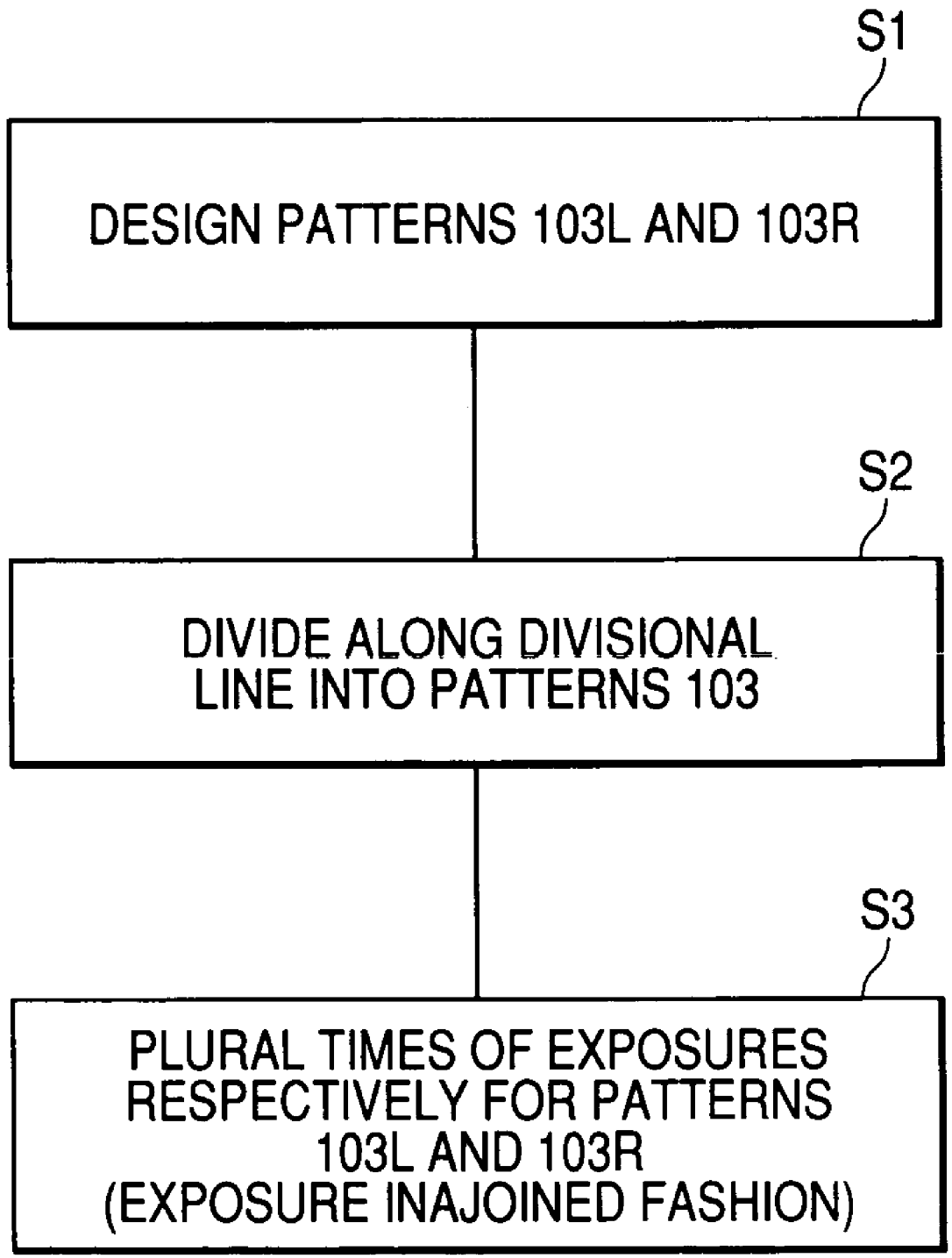

SOLID STATE IMAGE PICKUP DEVICE, METHOD FOR PRODUCING THE SAME, AND IMAGE PICKUP SYSTEM COMPRISING THE SOLID STATE IMAGE PICKUP DEVICE

BACKGROUND OF THE INVENTION

1. Field of the Invention

The present invention relates to a solid image pickup device having a plurality of solid image pickup elements comprising photoelectric conversion elements, a method for producing the same, and an image pickup system comprising the solid state image pickup device.

2. Related Background Art

A solid state image pickup device (hereinafter referred to simply as an image pickup device) having arranged one-dimensionally or two-dimensionally solid state image pickup elements (hereinafter referred to simply as image pickup elements) comprising light receiving areas having photoelectric conversion elements formed thereon is mounted as an area sensor on, for example, a digital camera, video camera, copier, facsimile or the like. Image pickup elements include, for example, CCD image pickup elements and amplification type image pickup elements.

An example of a circuit configuration of an amplification type image pickup device is shown in FIG. 10. The circuit of the image pickup device of FIG. 10 has in a unit pixel at least a photodiode 501 and an amplification transistor 502 amplifying optical signals stored in the photodiode 501. In each pixel, a plurality of drive lines 503 are arranged in a horizontal direction, and vertical output lines 504 and gland lines 505 are arranged in a vertical direction.

One pixel is comprised of an image pickup element as shown in FIG. 11. The image pickup element of FIG. 11 has a light receiving area 2002 formed on a substrate 2001, and a photoelectric conversion element (not shown) comprised of a photodiode 501 (see FIG. 10) is formed on the light receiving area 2002. The image pickup element of FIG. 11 further has patterns 2003 and 2004 for operating the photoelectric conversion element on the light receiving area 2002, an amplifier (not shown) amplifying charges generated in the light receiving area 2002, and the like. Generally, the patterns 2003 and 2004 are comprised of metals, semiconductors and the like and have a light blocking effect, and therefore the layout thereof is desirably arranged, as shown, such that incident light to the light receiving area 2002 is not blocked.

For receiving incident light more efficiently in the image pickup element, a variety of techniques for arranging light collecting means on the light receiving area have been proposed (e.g. Japanese Patent Application Laid-Open No. 8-321595).

The pickup element shown in FIG. 12 comprises a microlens 2210 as light collecting means. According to such a configuration, light incident to the microlens 2210 is collected toward the light receiving area 2202. An optical path for incident light is narrowed as the light receiving area 2202 is approached, and an opening having a size not so great that the opening interferes with the optical path is formed in a pattern 2205' arranged on the surface side. The patterns 2203 and 2204 are arranged with the optical path for incident light held therebetween. The arrangement position of the patterns 2203 and 2204 is not specifically limited but in the image pickup element shown in the figure, they are designed to be arranged in a position in which they interfere with the optical path for incident light and consequently, the optical path for incident light between the patterns 2203 and 2204 and the light receiving area 2202 has its shape regulated by the patterns 2203 and 2204.

In recent years, the image pickup device (area sensor) has tended to have an increased number of pixels with a large number of image pickup elements arranged in high density. Particularly, in an image pickup device of 35 mm full size standard called a large size, an exposure device for use in production of the image pickup device should be capable of processing a fine line width and performing exposure over a wide area. However, as an area to be exposed increases, the exposure device becomes hard to ensure a uniform line width in the full area and cannot form a fine line width.

For this problem, a technique has been proposed in which a pattern designed when a fine pattern is formed on one chip is divided into several patterns, and the divided patterns are exposed in a joined fashion (hereinafter referred to as exposure in joined fashion) (e.g. U.S. Pat. Nos. 5,561,317 and 5731131). If a layer not required to have a fine pattern is exposed, exposure in a joined fashion is not required, but a large area may be exposed collectively by a normal exposure process. In this way, a method in which an exposure process is selectively used according to the accuracy of a pattern is called a mix and match.

Exposure in a joined fashion will be briefly described with reference to FIG. 13. FIG. 13 is a top view showing an area in which the image pickup element is formed. As shown in FIG. 13, if a large size area 2101 exists, and an image pickup element (not shown) is formed in a two-dimensional form in an area 2102 in the area 2101, for example, a desired pattern is exposed in the area 2102 by exposing two divided areas 2103L and 2103R in different steps. In this case, in an area 2105 in which the areas 2103L and 2103R overlap one another (joined area), patterns printed in the respective exposure steps are joined together, whereby a pattern with a fine line width is exposed in the area 2102 having a size equal to or greater than a size capable of being exposed with one exposure by the exposure device.

As described above, the image pickup device tends to have an increased number of pixels, and is desired to have a large number of image pickup elements arranged in high density over a wide area. Thus, a pattern exposed on a substrate becomes denser and finer.

In this way, however, there arises a problem of misalignment of a pattern formation position associated with alignment accuracy of the exposure device if a fined pattern is exposed. For example, in the image pickup element of FIG. 12, even if the position of a pattern 2203 shown in the figure is an ideal position in terms of design, the pattern is misaligned like, for example, a pattern 2203' depending on misalignment of the exposure device exposing the pattern 2203.

If the pattern and the optical path interfere with each other, and the optical path is substantially regulated by the pattern, or the pattern does not interfere with the optical path in design but a distance between the pattern and the optical path is very small, the optical path for incident light is deformed, resulting in variations in sensitivity of the image pickup element if the pattern is misaligned. Particularly, the image pickup element formed in the joined area of the image pickup device is significantly influenced by the misalignment described above because divided patterns are individually exposed with a divisional line therebetween in different steps.

SUMMARY OF THE INVENTION

An object of the present invention is to provide a solid state image pickup element having fine patterns formed thereon without being influenced by alignment accuracy of an exposure device, a method for producing the same, and an image pickup system comprising the solid state image pickup element.

For achieving the above object, a method for producing a solid state image pickup device of the present invention is a method for producing a solid image pickup device comprising a light receiving area photoelectrically converting incident light, an insulation layer deposited on the light receiving area, a plurality of first patterns arranged with an optical path for the incident light incident to the light receiving area placed therebetween, comprising the steps of:

Designing the first pattern so that the shortest distance between the each first pattern and the optical path is larger than alignment accuracy of an exposure device exposing the first pattern;

designing the first pattern;

dividing the first pattern into a plurality of patterns; and exposing in different steps the divided patterns into of the first pattern. More preferably, the shortest distance between the first pattern and the optical path is equal to or greater than three times as large as the alignment accuracy of the exposure device.

According to the present invention, even if the first patterns arranged with the optical path for incident light placed therebetween are exposed by exposure in a joined fashion, the divided first patterns are designed to be at a predetermined distance, i.e. a distance longer than the alignment accuracy of the exposure device, from the optical path, and therefore there is no possibility that the first pattern is exposed in a position in which it interferes with the optical path even if misalignment occurs during exposure.

The production method according to the present invention may further comprise a step of collectively forming a second pattern having an opening regulating the optical path for incident light. The second pattern may be formed on the surface side from the above first pattern formed by exposure in a joined fashion.

The "second pattern" means a pattern formed by one-shot exposure. The "first pattern" described above means a pattern exposed by exposure in a joined fashion. Both patterns do not necessarily have an effect of blocking incident light, but include patterns being transparent to incident light but changing characteristics of a wavelength of the passed incident light. The "patterns changing characteristics of a wavelength of incident light" include, for example, color filters.

The production method according to the present invention may further comprise a step of depositing a first insulation layer on the light receiving area before the step of exposing the divided first patterns in different steps, and the step of exposing the divided first patterns in different steps may comprise exposing the first patterns on the first insulation layer, and the production method may further comprise a step of forming a second insulation layer having a reflection index smaller than that of the first insulation layer on the first insulation layer.

The solid state image pickup device according to the present invention is a solid state image pickup device comprising:

a light receiving area photoelectrically converting incident light;

a layer having formed thereon a first pattern formed on the light incidence side from the light receiving area by exposure in a plurality of steps; and a layer having formed thereon a second pattern formed on the light incidence side from the light receiving area by one-shot exposure and having an opening regulating an optical path for the incident light wherein the first pattern is arranged in a position in which the first pattern does not interfere with the optical path for the incident light passing through the opening.

The above solid state image pickup device may have further light collecting means for collecting incident light, formed on the light incidence side from the first pattern and the second pattern. The first pattern may be formed between the second pattern and the light receiving area. In this case, the first insulation layer may be formed between the light receiving area and the first pattern, and the second insulation layer having a refraction index smaller than that of the first insulation layer may be formed between the first pattern and the second pattern. The second pattern may be arranged between the first pattern and the light receiving area, or second light collecting means may be formed between the light collecting means and the light receiving area.

The image pickup system according to the present invention comprises:

a processing unit comprising the above solid state image pickup device according to the present invention or the solid state image pickup device produced by the production method according to the present invention; and processing means for processing output signals from the solid state image pickup apparatus to generate image data;

a recording unit storing the image data;

an optical unit forming a subject image on a screen surface of the solid state image pickup device; and a control unit controlling the processing unit, the recording unit and the optical unit. With the image pickup system configured in this way, good image data having reduced variations among pixels is obtained.

According to the present invention, the first pattern is designed with a predetermined distance provided between the first pattern exposed in a joined fashion and the optical path for incident light, and divided patterns into which the first pattern is divided are exposed in a joined fashion, whereby the first pattern is prevented from being exposed in the optical path, and variations in sensitivity of the image pickup element formed in the joined area are reduced. Thus, the image pickup element of the solid state image pickup device has a uniform sensitivity. The image pickup system comprising the solid state image pickup device according to the present invention generates good image data having reduced variations.

BRIEF DESCRIPTION OF THE DRAWINGS

FIG. 2A shows a schematic step until a pattern to be exposed by exposure in a joined fashion is exposed;

FIGS. 2B, 2C, 2D and 2E show steps of producing the image pickup device shown in FIGS. 1A and 1B;

DESCRIPTION OF THE PREFERRED EMBODIMENTS

Embodiments of the present invention will be described below with reference to drawings.

First Embodiment

Figure 1A:
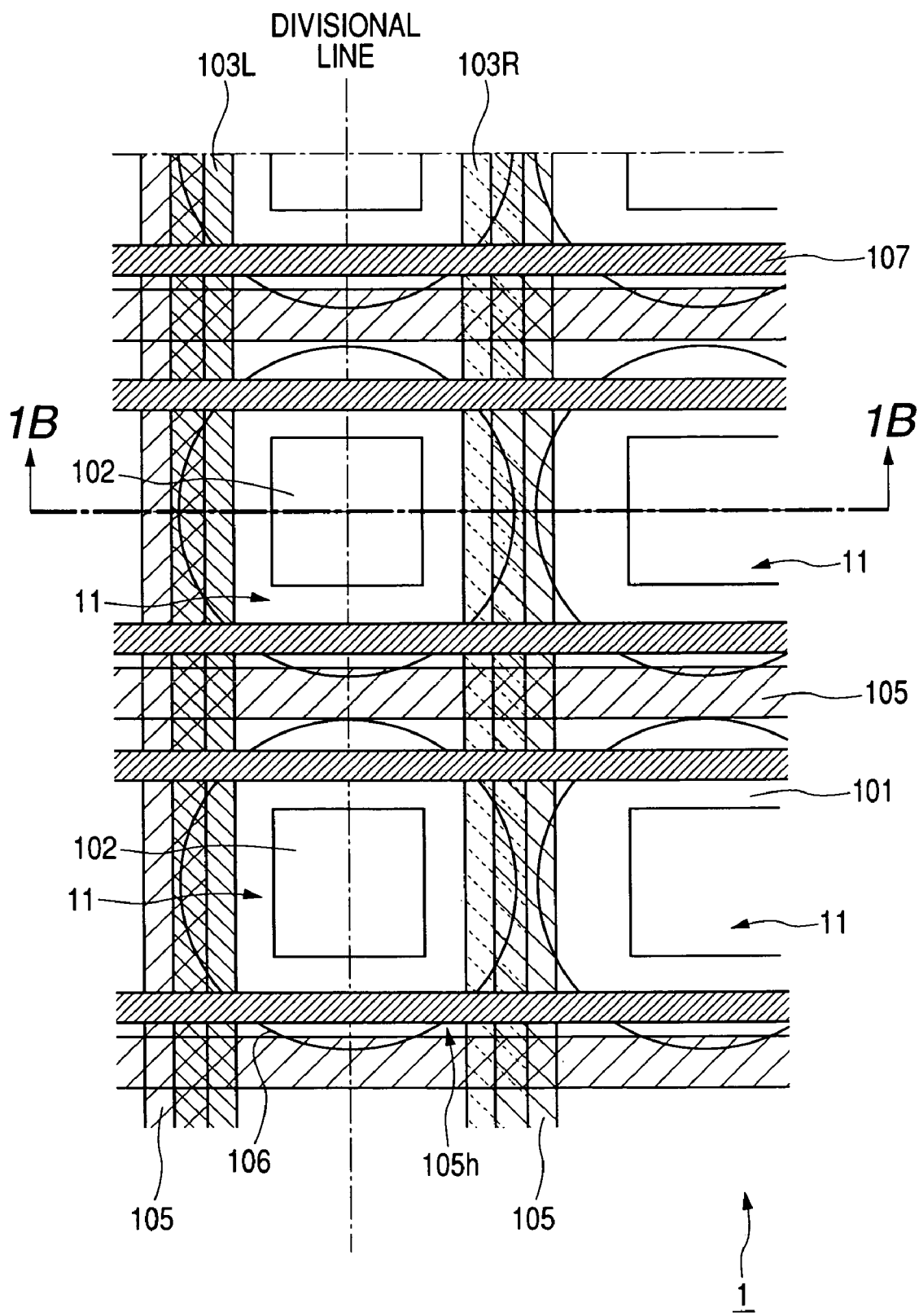
FIG. 1A is a top view showing wiring of an image pickup device according to the first embodiment, which is produced by a production method of the present invention.
Figure 1B:
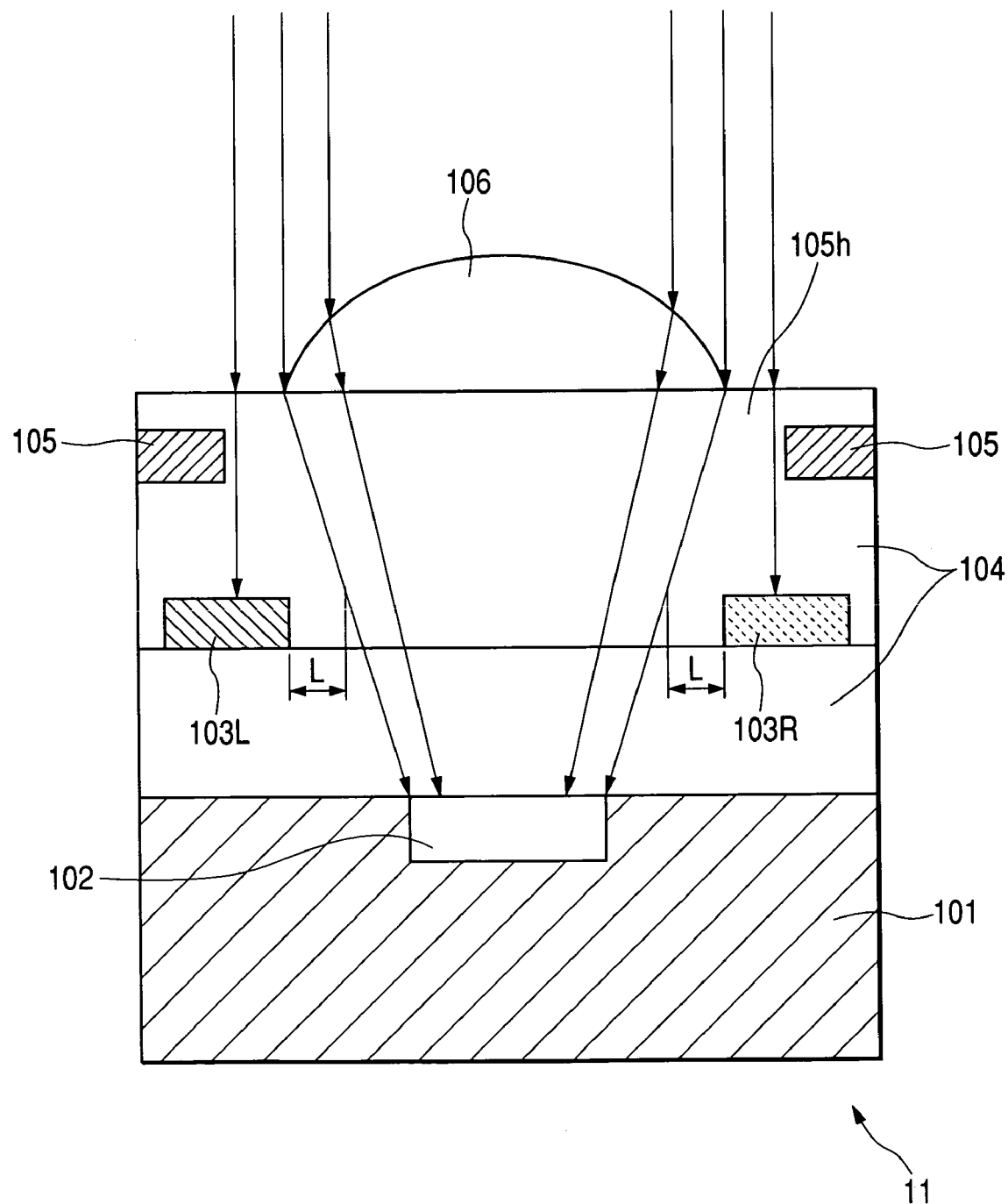
FIG. 1B is a sectional view showing an image pickup element of the image pickup device taken along a line 1B-1B in FIG. 1A.

FIG. 1A is a top view showing wiring of an image pickup device according to the first embodiment, which is produced by a production method of the present invention. FIG. 1B is a sectional view showing an image pickup element of the image pickup device taken along a line 1B-1B in FIG. 1A.

As shown in FIGS. 1A and 1B, an image pickup device 1 has a plurality of image pickup elements 11 arranged in a matrix form at predetermined spaces on a substrate 101.

As shown in FIG. 1B, the image pickup element 11 has a light receiving area 102 having a photoelectric conversion element (not shown) formed thereon, an insulation layer 104 deposited on a substrate 101 in such a manner as to cover the light receiving area 102, and a microlens 106 placed on the surface of the insulation layer 104. The materials of components and methods for forming them are almost same as those of a well known image pickup element, and therefore detailed descriptions thereof are not presented. The image pickup element 11 shown in FIG. 1B is an element exposed in a joined fashion with a divisional line between the elements shown in FIG. 1A.

The substrate 101 is formed with, for example, a silicon substrate. For a photoelectric conversion element formed on the light receiving area 102 on the substrate 101, a photodiode or phototransistor may be used. For example, the photoelectric conversion element may be provided as a photodiode obtained by forming the substrate 101 with a p type semiconductor, forming an N type semiconductor on the light receiving area 102 and jointing the former with the latter in a PN junction.

The shape of the light receiving area 102 when viewed from the top face side is not limited in any way, but it is formed as a rectangular area as shown in FIG. 1A in this embodiment. For transmitting electric signals generated in the light receiving area 102, patterns 103L and 103R (first patterns) of vertical output lines are arranged in parallel to each other in both sides of the light receiving area 102. Drive lines 107 extending in a direction orthogonal to patterns 103L and 103R and made of, for example, Al material are arranged with each light receiving area 102 held therebetween. On an area between adjacent light receiving areas 102, metal wiring 105 (second pattern) made of, for example, Al material is arranged in a form of a lattice surrounding each light receiving area 102. The image pickup device 1 having such a configuration functions as an area sensor having as pixels a plurality of image pickup elements 11 formed on the substrate 101.

As shown in FIG. 1B, the insulation layer 104 provides electrical insulation between the patterns 103L and 103R and metal wiring 105 and is provided as a layer for protecting them. The material of the insulation layer 104 is not specifically limited, but is preferably a material transparent to visible light or infrared light and for example, silicon oxides, silicon oxides doped with phosphor, boron, nitrogen, fluorine and the like, silicon nitrides and acrylic resins should be used.

The microlens 106 is placed on the insulation layer 104, and its optical axis is positioned at the center of the light receiving area 102. The microlens 106 is formed as a convex lens raised upward, i.e. toward the side of incidence of incident light (light incidence side), and the material thereof may be, for example, a resin. Light incident to the microlens 106 is collected in the light receiving area 102. Color filter (not shown) may be formed just below the microlens 106.

The metal wiring 105 may be formed on the surface side of the insulation layer 104, and an opening 105h provided in a sufficient clearance so as not block the optical path for incident light passing through the microlens 106. The metal wiring 105 does not require precise process accuracy compared with the patterns 103L and 103R, and is formed by one-shot exposure over an entire area (not shown) on which image pickup elements 11 are arranged.

The patterns 103L and 103R are formed between the metal wiring 105 and the light receiving area 102, a distance between the patterns 103L and 103R is set so as not to block the optical path for incident light, and the patterns 103L and 103R are located symmetrically with respect to the optical axis of the microlens 106. And the patterns 103 and 103R are set so that the shortest distance (clearance) from the optical path for incident light is a distance L.

The "shortest distance from the optical path" means the shortest distance between the patterns 103L and 103R and the optical path in a horizontal direction, i.e. a direction in which the patterns 103L and 103R are misaligned on the exposure surface. The "distance L" is a distance set to a value greater than the alignment accuracy of the exposure device exposing the patterns 103L and 103R. The "alignment accuracy of the exposure device" means a standard deviation σ being an amount of variations in alignment of the exposure device.

In this embodiment, the distance L should have a value larger than the alignment accuracy of the exposure device, and is more preferably equal to or greater than three times as large as the alignment accuracy of the exposure device.

A method for producing the image pickup device 1 designed as described above will be described below.

A rough production step until the patterns 103L and 103R are exposed is as shown in a flowchart of FIG. 2A, and has a step (S1) of designing the patterns 103L and 103R so that the distance between the optical path for incident light and the patterns 103L and 103R equals the distance L described above, a step (S2) of dividing designed patterns 103L and 103R into a plurality of patterns with a predetermined divisional line as a boundary, and a step (S3) of individually exposing the divided patterns 103L and 103R by exposure in a joined fashion in different steps.

Thus, the image pickup device 11 is produced as described below based on data designed so that the distance from the optical path equals the distance L.

Figures 2B, 2C, 2D, 2E:
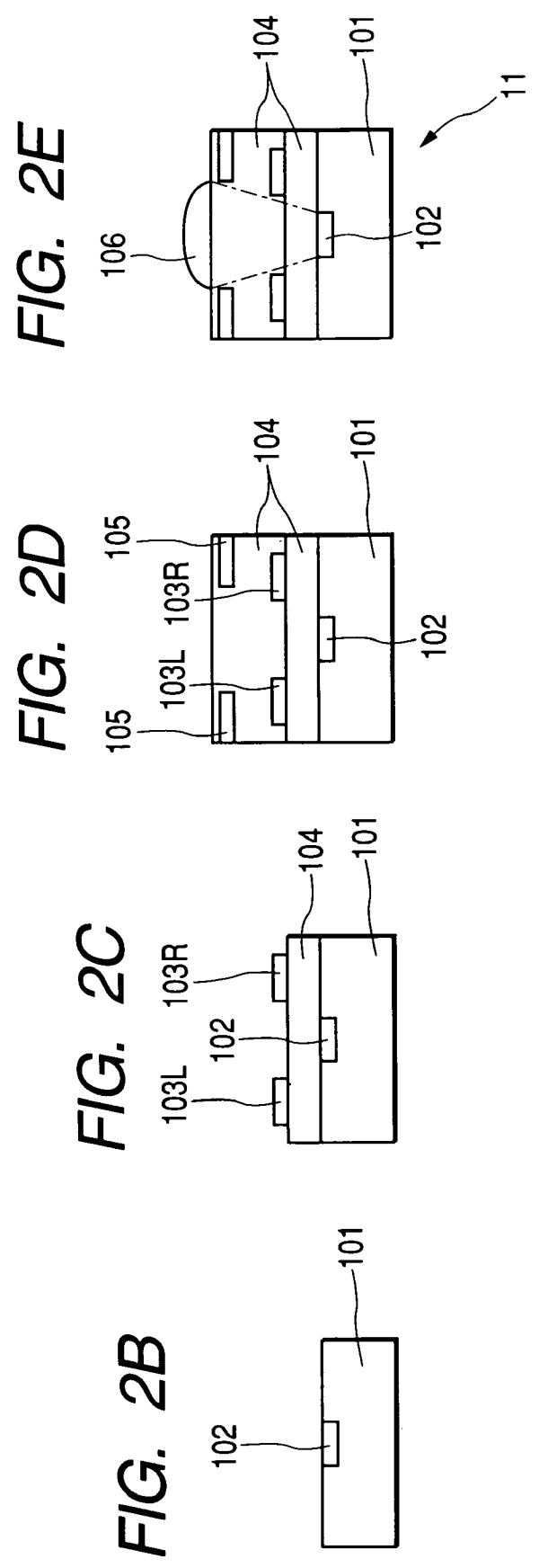

First, as shown in FIG. 2B, the substrate 101 is prepared, and the light receiving area 102 comprising a photodiode and the like is formed on the substrate 101. An active element such as an amplification transistor (not shown) for amplifying electric signals generated by photoelectric conversion by the light receiving area 102 is provided if necessary.

Then, as shown in FIG. 2C, the insulation layer 104 covering the light receiving area 102 is deposited by thermal oxidation, the CVD (chemical vapor deposition) method, the sputtering method or the like. Patterns 103L and 103R are exposed on the surface of the insulation layer 104 by exposure in a joined fashion in different steps. Alignment of the exposure device may be performed on the basis of an alignment mark provided at a predetermined position.

After the patterns 103L and 103R are formed, the insulation layer 104 is further deposited on the patterns 103L and 103R as shown in FIG. 2D. Patterns of metal wiring 105 are formed on the insulation layer 104 by one-shot exposure.

Thereafter, as shown in FIG. 2E, the microlens 106 is collectively placed at a position corresponding to each light receiving area 102. By the steps described above, the image pickup element 11 of this embodiment is formed.

According to the method for producing the image pickup device 1 of this embodiment described above, even if patterns 103L and 103R arranged in such a manner as to hold therebetween the optical path for incident light collected by the microlens 106 are exposed in a joined fashion in different exposure steps, the patterns 103L and 103R are never formed at positions in which the optical path for incident light is blocked even if the exposure device is misaligned because the patterns 103L and 103R are set to be arranged at a distance L from the optical path for incident light. Thus, the amount of light incident to the light receiving area 102 remains constant, and variations in sensitivity of the image pickup element 11 in the joined area are inhibited.

In this embodiment, the patterns 103L and 103R are each shown as one wire extending in a vertical direction (see FIG. 1A) for the sake of simplicity of explanation, but the shape of patterns is not limited thereto as a matter of course. For example, the shape of patterns may be such that a horizontal pattern element extending across a divisional line is provided, the horizontal pattern is divided near the divisional line, the divided patterns are exposed in a joined fashion and joined together. The arrangement of patterns 103L and 103R is not limited to an arrangement in which the distances between the patterns 103L and 103R and the optical path for incident light are the same as in the image pickup element 11 (see FIG. 1B) and for example, it may be an arrangement in which the distance between the pattern 103L and the optical path equals L and the distance between the pattern 103R and the optical path is 3L. The image pickup element 11 (see FIG. 1B) has patterns 103L and 103R and metal wiring formed in one layer, but patterns (corresponding to patterns 103L and 103R) exposed by exposure in a joined fashion and patterns (corresponding to metal wiring 105) exposed by one-shot exposure may be formed on a plurality of layers.

The effect of the present invention can be obtained as long as the material of patterns 103L and 103R has an action of reducing incident light, and the material is not limited to a metal and the like, but may be a color filter, ITO (Indium-Tin-Oxide) or the like. The color filter and ITO are transparent to incident light, but have an action of selectively passing or attenuating only light of predetermined wavelengths in a predetermined band. This is because even in this pattern, wavelength characteristics of incident light are changed by blocking the optical path, and therefore the result of receiving light in the light receiving area 102 is influenced.

Figure 9:
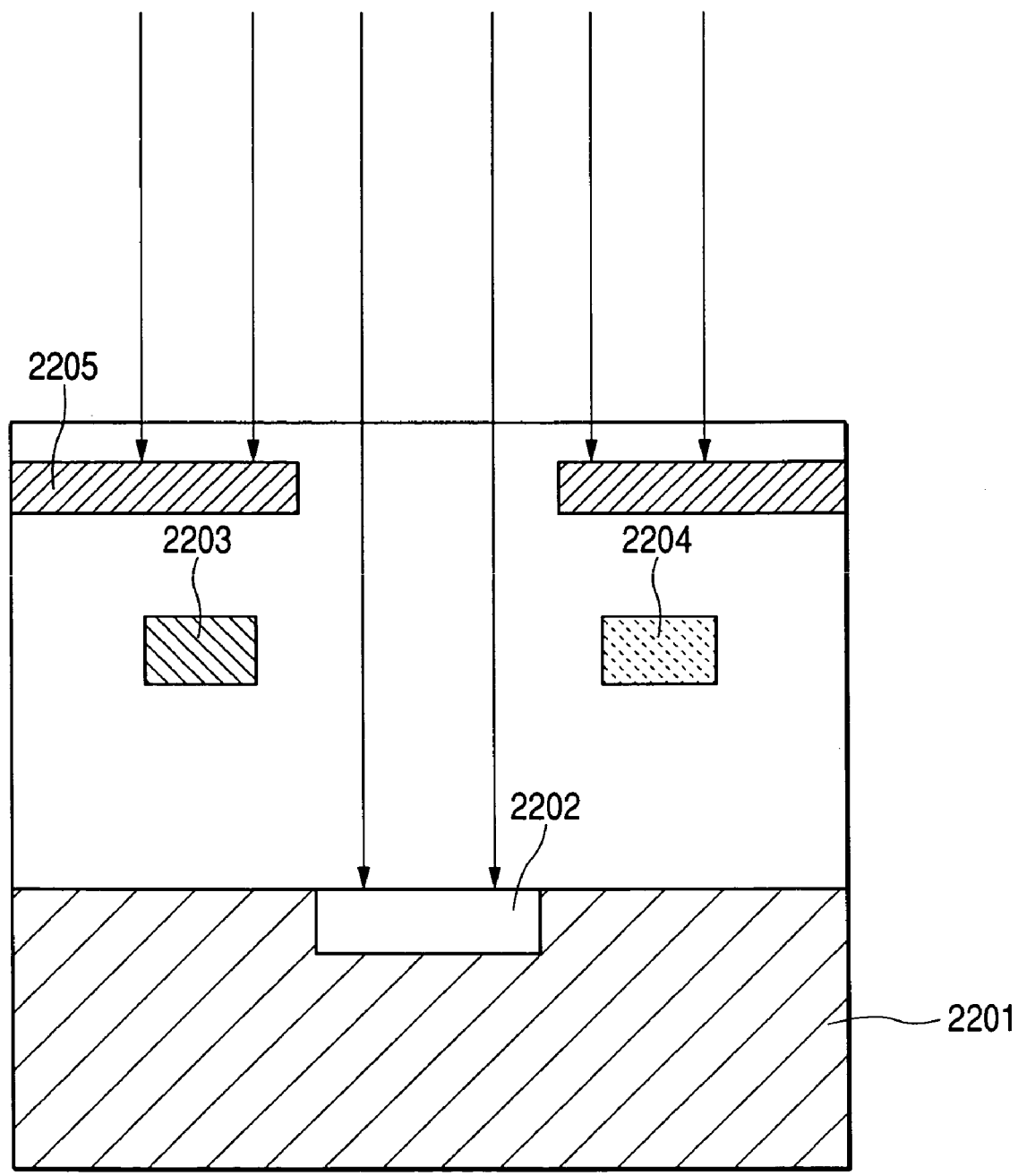
FIG. 9 is a sectional view of the image pickup element according to one example of the present invention.
Figure 10:
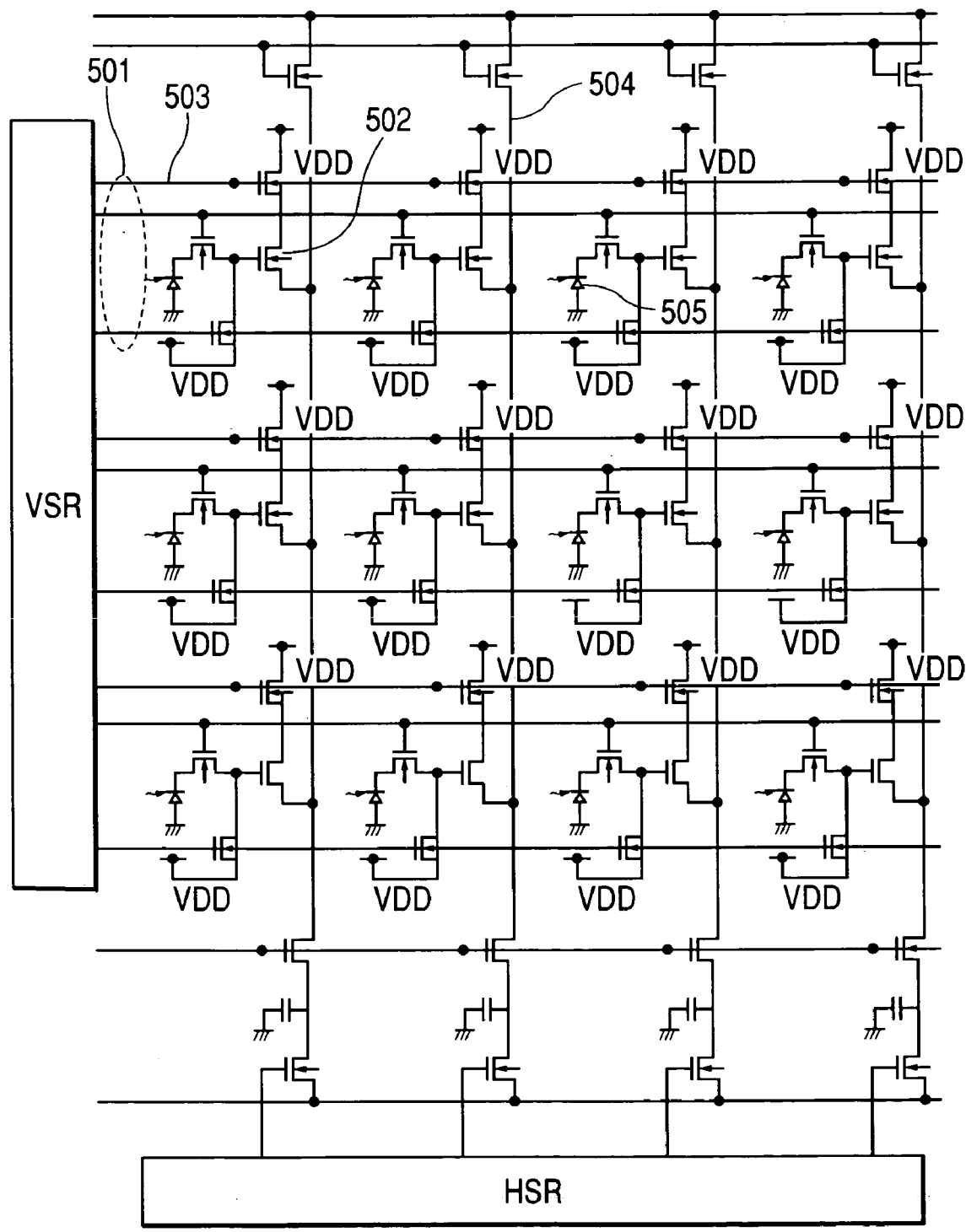
FIG. 10 is a circuit diagram showing an example of a circuit configuration of an amplification type solid state image pickup element.
Figure 11:
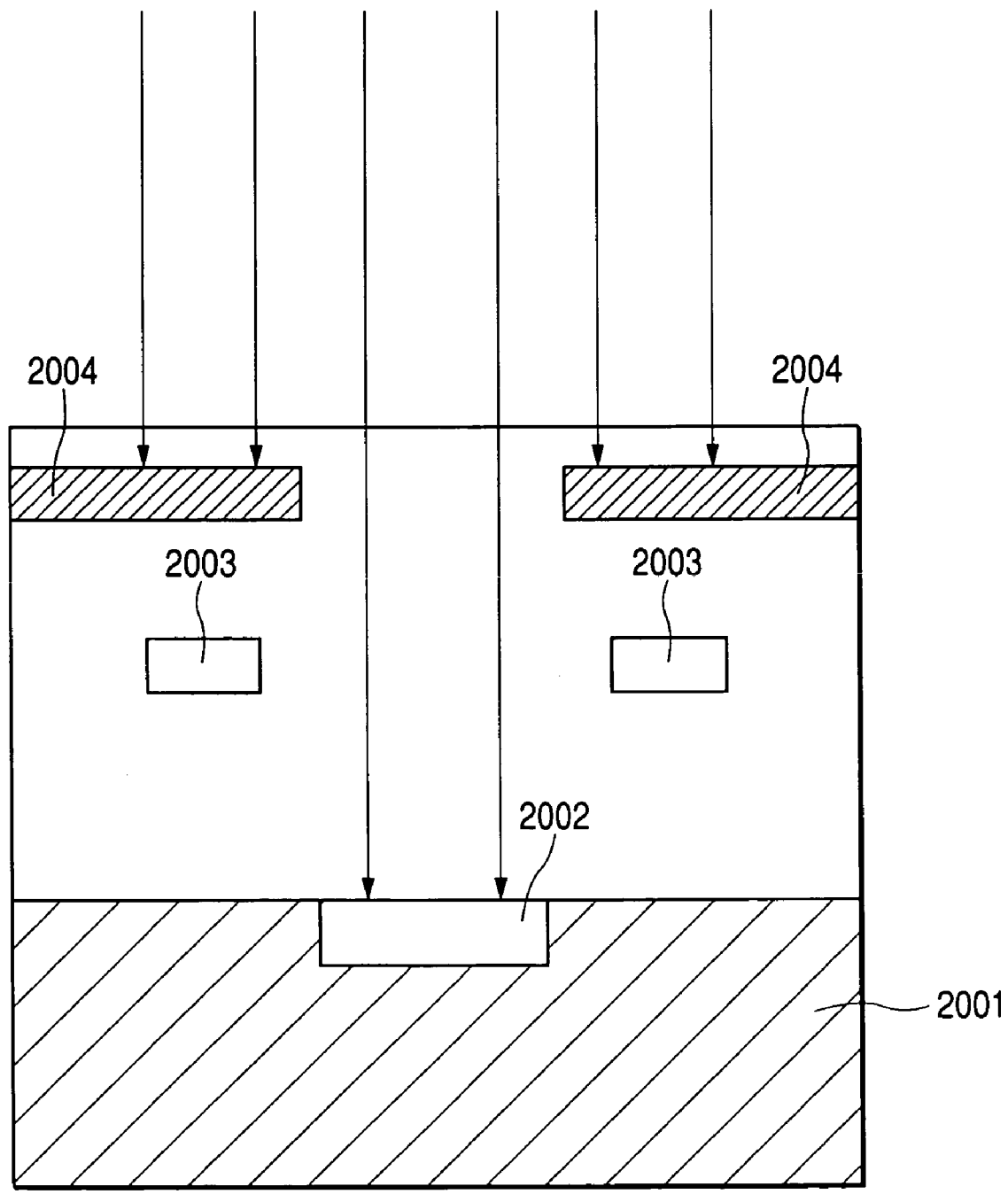
FIG. 11 is a sectional view showing an example of a configuration of the conventional image pickup element.
Figure 12:
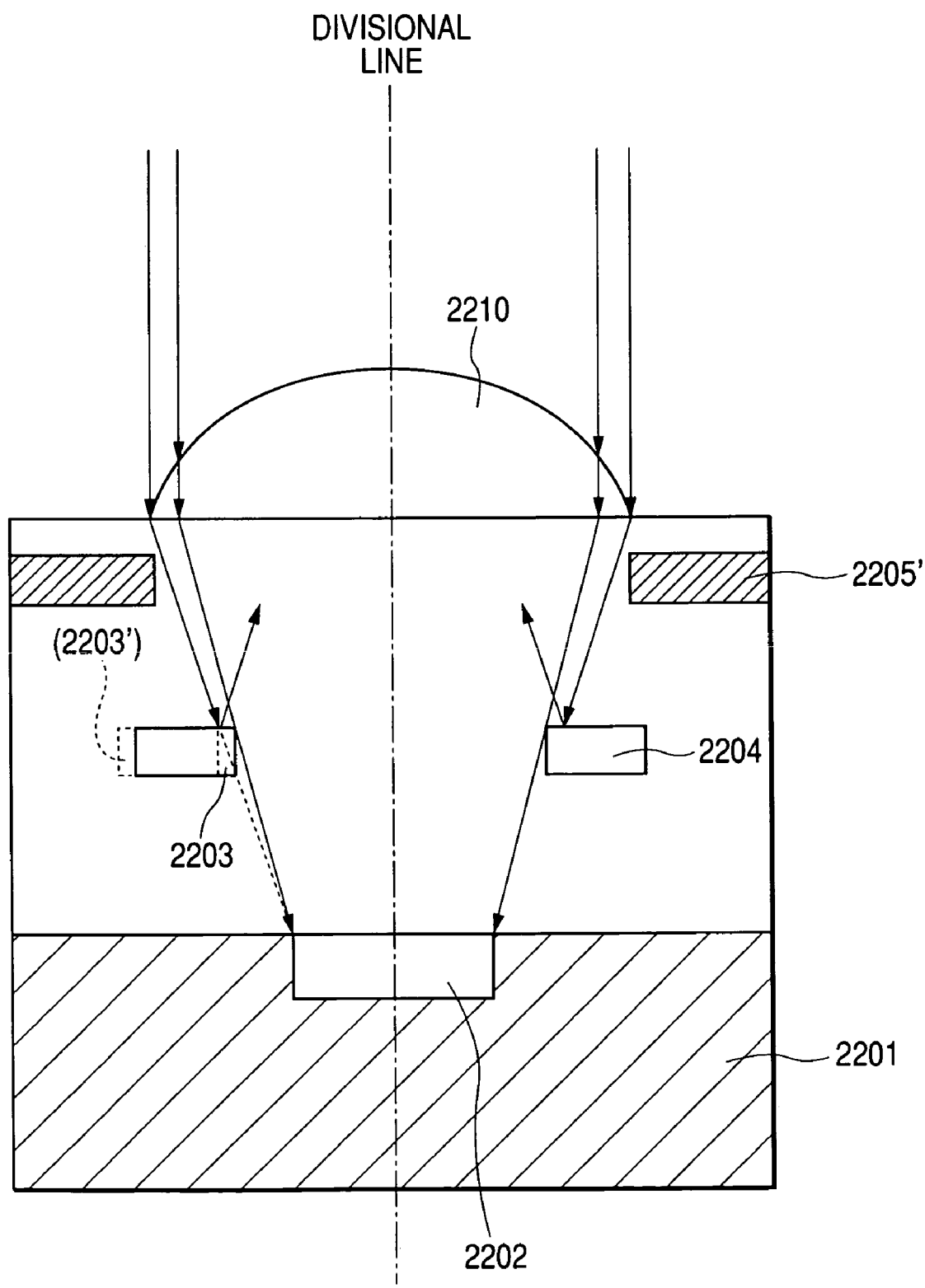
FIG. 12 is a sectional view showing one example of the image pickup element comprising collection means.
Figure 13:
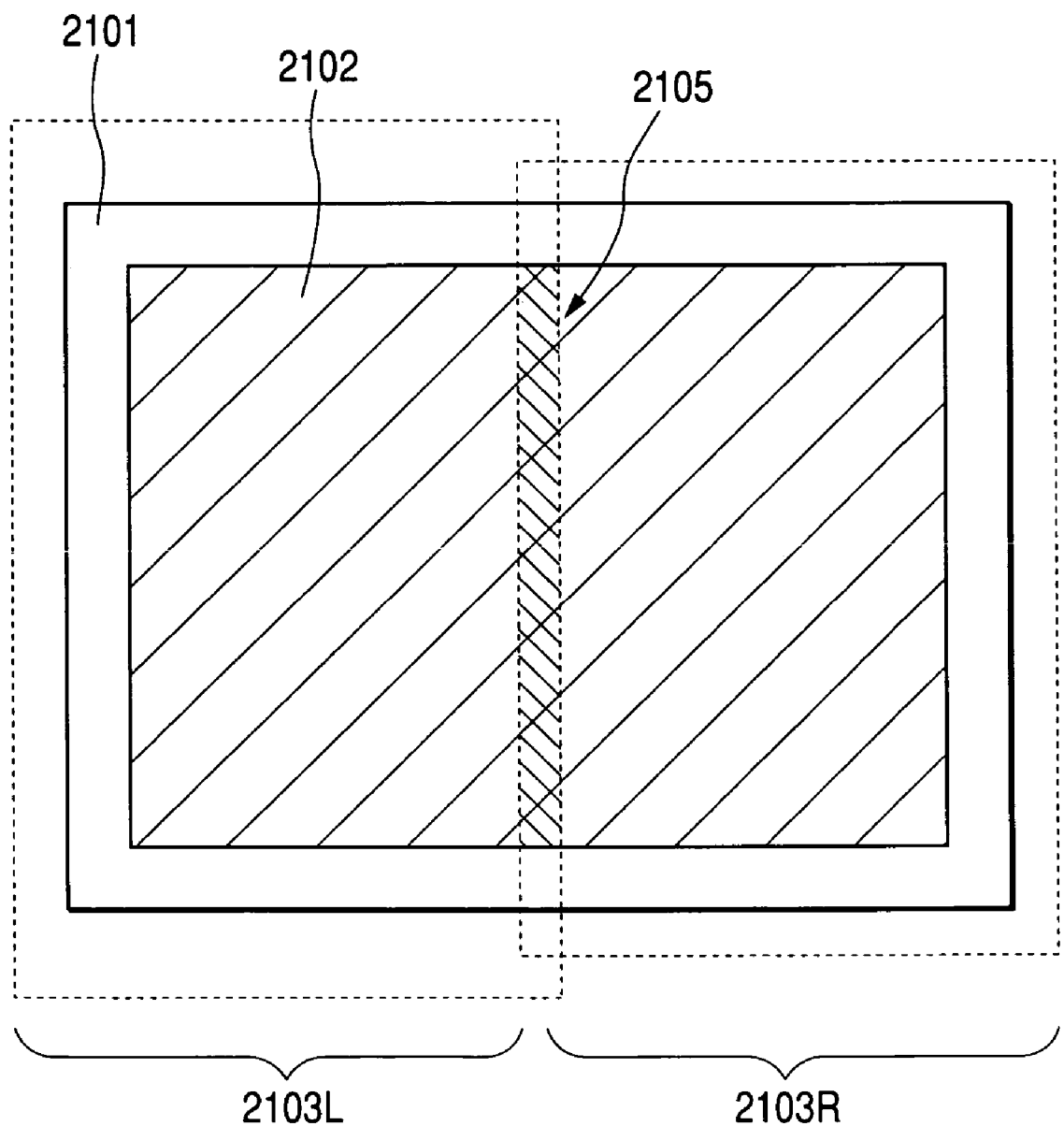
FIG. 13 is a view for explaining exposure in a jointed fashion, which is a top view showing an area on which the image pickup element is formed.

The image pickup element 11 (see FIG. 1B) has the microlens 106, but the microlens 106 is not an absolutely necessary component for the invention, the invention described above can be applied to an image pickup element having no microlens as shown in FIG. 9, for example.

In the image pickup element of FIG. 9, the light receiving area 2202 is formed on the substrate 2201 and above the light receiving area 2202 (on the light incidence side), patterns 2203 and 2204 exposed by exposure in a joined fashion in different steps are formed in the same height. A pattern 2205 formed by one-shot exposure is arranged above the patterns 2203 and 2204. The pattern 2205 has an opening for introducing incident light into the light receiving area 2202. Even in the image pickup element having such a configuration, the clearances between the patterns 2203 and 2204 and the optical path for incident light each equal to the distance L described above, whereby patterns 2203 and 2204 are never formed in the optical path for incident light even if misalignment occurs during exposure.

In this embodiment, the image pickup device has been described taking an amplification type image pickup element as an example, but it may be charge coupled device (CCD) type one.

The method for producing the solid state image pickup device of the present invention is not exclusively applied to what has been described above but can be applied to a variety of image pickup devices. An example of the image pickup device produced according to the present invention will be described with reference to the drawings.

Second Embodiment

The opening 105$h$ of the metal wiring 105 is formed with a sufficient clearance from the optical path for incident light as shown in FIG. 1B in the first embodiment, but the opening of metal wiring may be smaller so that the optical path for incident light is substantially regulated.

Figure 3:
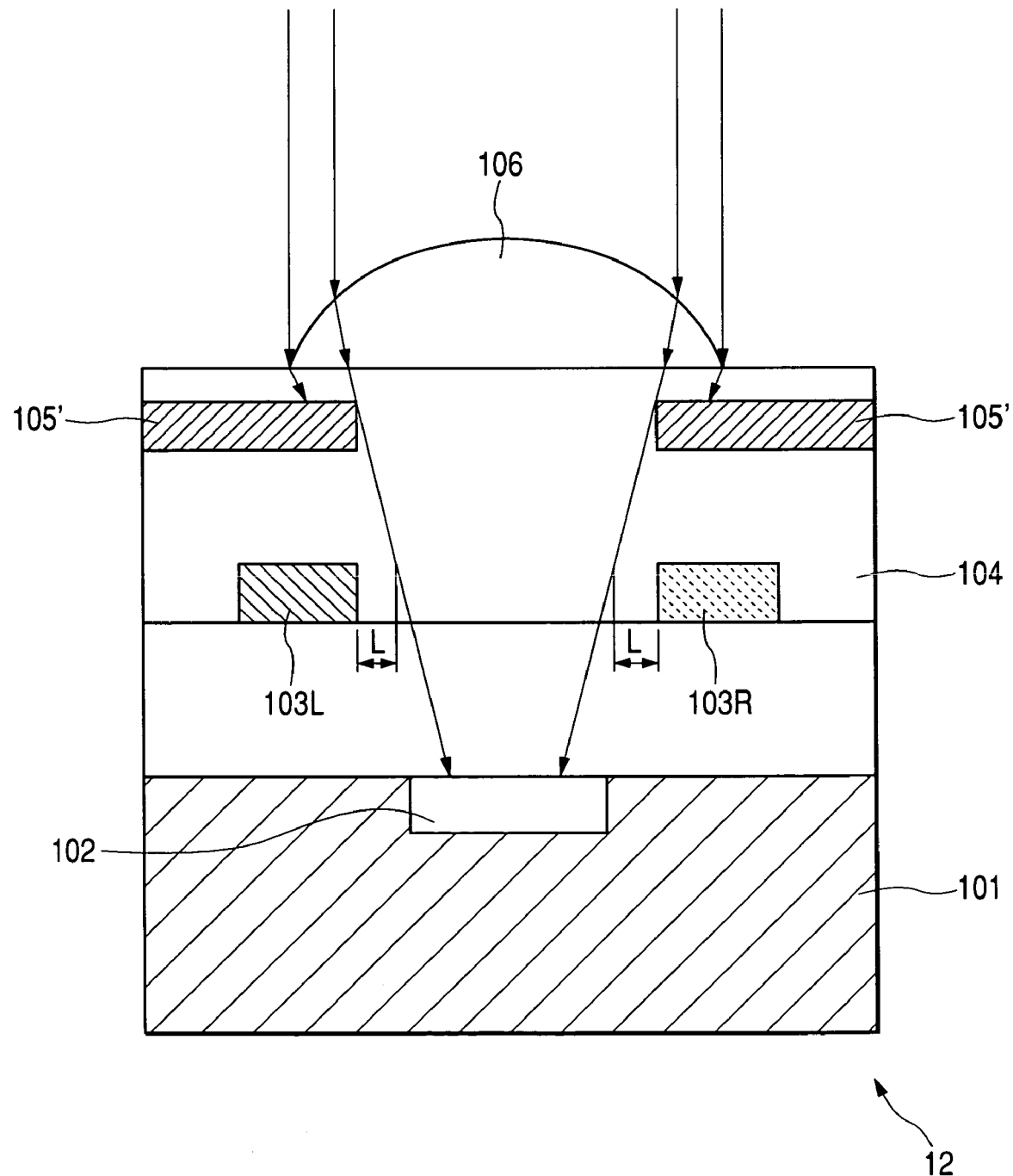
FIG. 3 is a sectional view showing the image pickup element of the second embodiment according to the present invention.

An image pickup element 12 shown in FIG. 3 has a smaller opening of metal wiring 105' compared with the image pickup element 11 of the first embodiment shown in FIG. 1A, but is same as the image pickup element 11 for other configurations, and structural parts having same functions are given symbols identical to those of FIG. 1B and the descriptions thereof are not presented.

The metal wiring 105' is designed so that the center of its opening is located on an optical axis of the microlens 106. It is designed so that incident light collected by the microlens 106 passes through the opening to the light receiving area 102. In this way, by reducing the opening of the metal wiring 105', the area of an area on which the metal wiring 105' can be increased, and therefore the degree of freedom in the design of the metal wiring 105' is advantageously improved. The metal wiring 105' is collectively exposed as in the case of the first embodiment.

Even in production of the image pickup element 12 having such a configuration, the patterns 103L and 103R are designed so that the clearance from the optical path for incident light equals the distance L, whereby the patterns 103L and 103R are never formed in the optical path even if they are exposed by exposure in a joined fashion, and an effect same as that of the first embodiment can be obtained.

Third Embodiment

An insulation layer may be composed of two or more layers having different refraction indexes. The image pickup element 13 shown in FIG. 4 has an insulation layer 104 and an insulation layer 204 having a refraction index smaller than that of the insulation layer 104. Other configurations are same as those of the image pickup element 12 of FIG. 3, and components having same functions are given symbols identical to those of FIG. 3 and the descriptions thereof are not presented.

In the image pickup element 13, the insulation layer 204 having a refraction index smaller than the insulation layer 104 is formed between the metal wiring 105' and the patterns 103L and 103R. In this way, incident light collected by the microlens 106 passes through the insulation layer 104 and incidents into the insulation layer 204 and is then refracted toward the optical axis at the interface between the insulation layers 104 and 204. Then, when the incident light enters the insulation layer 104 from the insulation layer 204, it is refracted again and enters the light receiving area 102.

In the image pickup element 13 having such a configuration, the patterns 103L and 103R are set so that the clearance from the optical path for incident light equals the distance L, and are exposed in a joined fashion, whereby an effect same as that of the above embodiment can be obtained. In the image pickup element 13, the optical path at the lower end of the insulation layer 204, i.e. at a position in which it is held between the patterns 103L and 103R is smaller than the optical path when the insulation layer 204 is not provided (shown by dotted lines in the figure), and therefore an area on which the patterns 103L and 103R are arranged relatively increases. As a result, the degree of freedom of arrangement of patterns is improved. For example, by increasing the distance between the pattern 103L and an adjacent pattern 103L', improvement in yield can be expected.

Fourth Embodiment

Light collecting means may be provided in the insulation layer as means for refracting incident light in the insulation layer.

Figure 4:
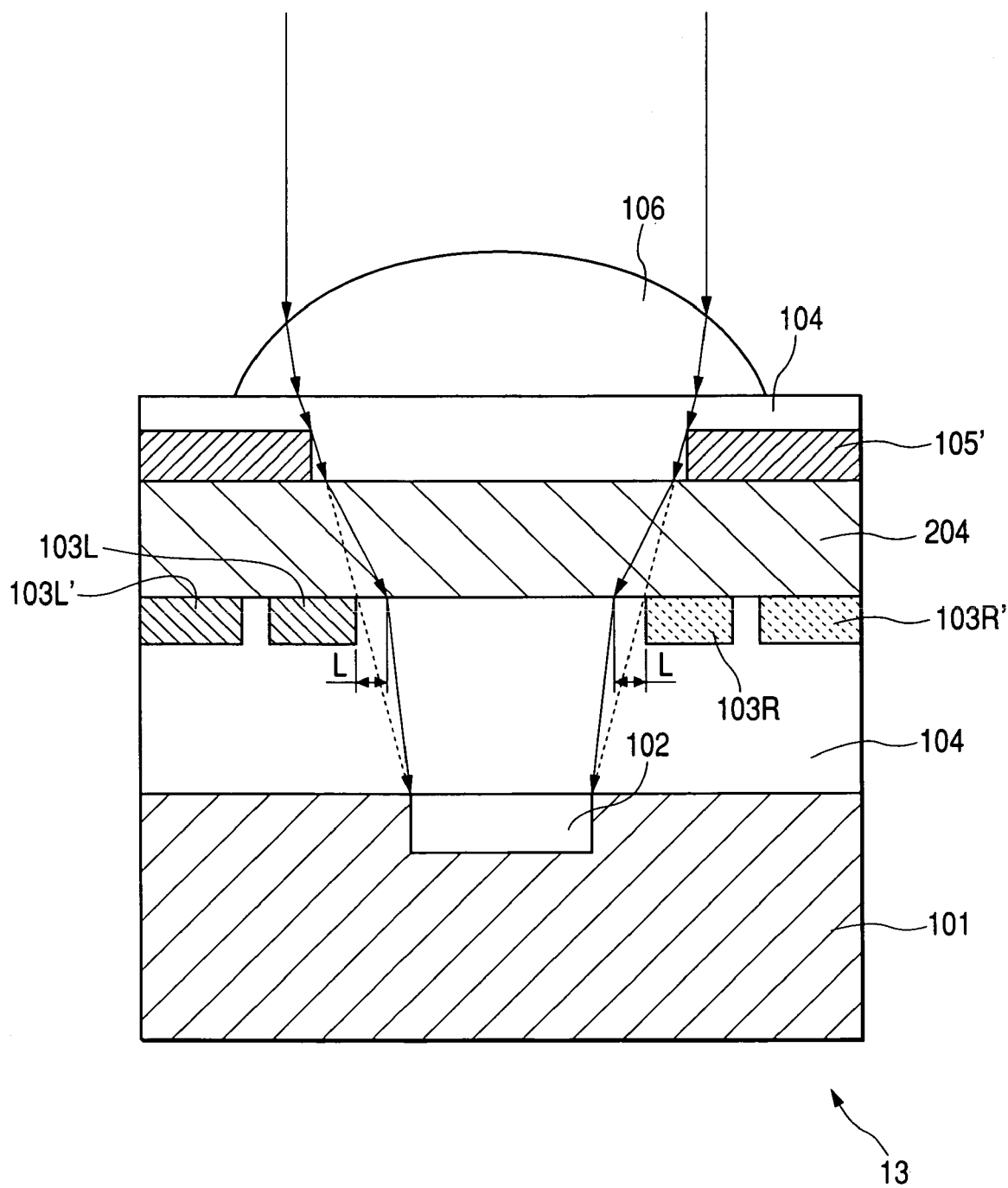
FIG. 4 is a sectional view showing the image pickup element of the third embodiment according to the present invention.
Figure 5:
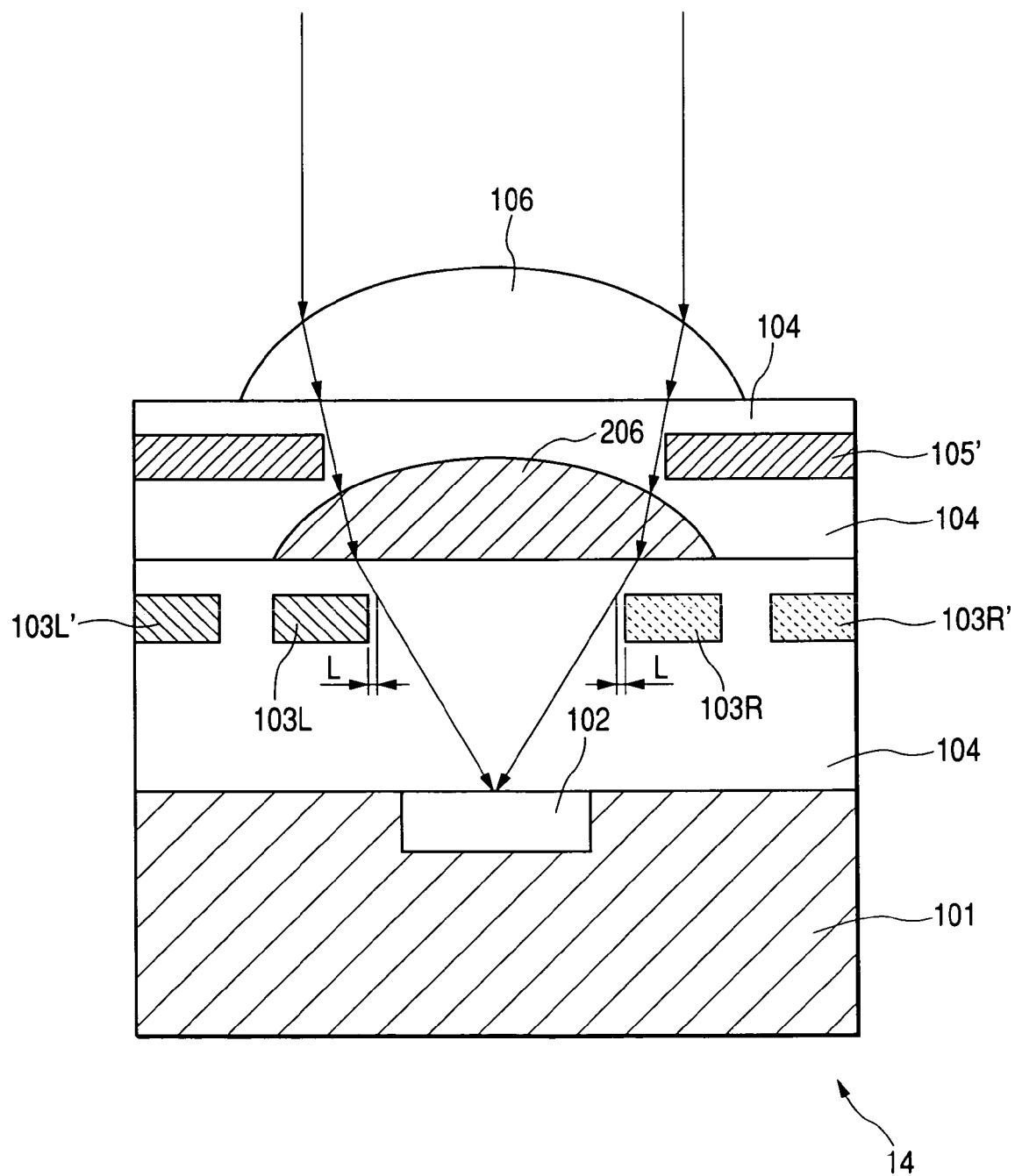
FIG. 5 is a sectional view showing the image pickup element of the fourth embodiment according to the present invention.

The image pickup element 14 shown in FIG. 5 has a microlens 206 formed in the insulation layer 104 instead of the insulation layer 204 of the image pickup element 13 of FIG. 4. The microlens 206 is composed of a material having a refraction index larger than that of the insulation layer 104, and has a convex shape raised toward the surface side. In this way, light incident from the microlens 106 is further collected by the microlens 206 and received by the light receiving area 102. Even such an image pickup element 14 can provide an effect same as that of the third embodiment.

Fifth Embodiment

Figure 6:
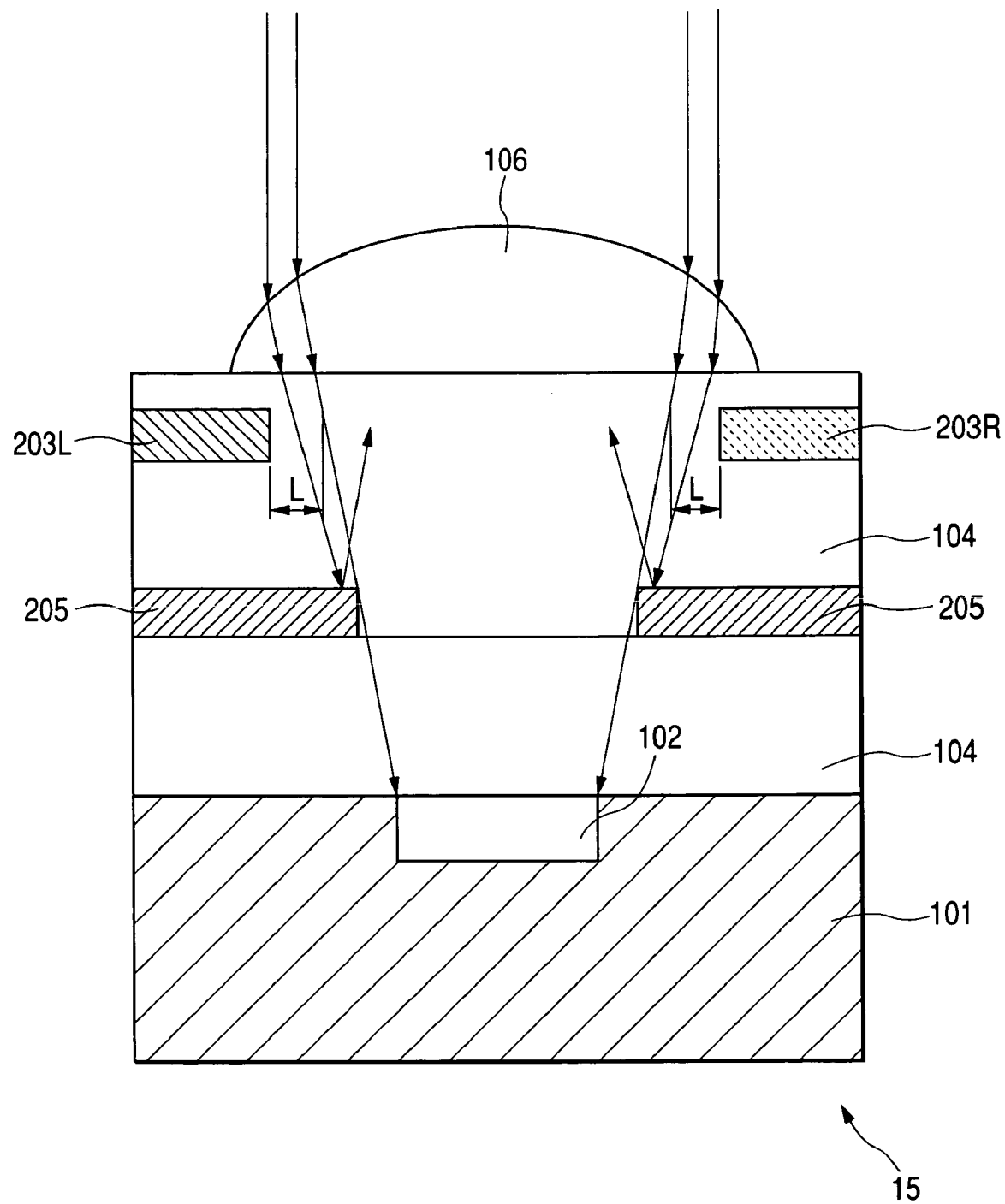
FIG. 6 is a sectional view showing the image pickup element of the fifth embodiment according to the present invention.

Metal wiring 105 and 105' is arranged on the surface side in the embodiment described above, but the metal wiring 205 may be provided below patterns 203L and 203R formed by exposure in a joined fashion as in an image pickup element 15 shown in FIG. 6, for example.

In the image pickup element 15, the patterns 203L and 203R are arranged on the insulation layer 104 on the surface side, and metal wiring 205 formed by one-shot exposure is arranged between the patterns 203L and 203R and the light receiving area 102. Other configurations are same as those of the image pickup element 11 of FIG. 1, and components having same functions are given symbols identical to those of FIG. 1 and descriptions thereof are not presented.

In the image pickup element 15, an optical path for incident light passing through the microlens 106 is regulated by an opening of the metal wiring 205, and only incident light passing through the opening reaches the light receiving area 102. The patterns 203L and 203R formed above the metal wiring 205 are designed so that the clearance from the optical path regulated by the opening equals the distance L, whereby an effect same as that of the second embodiment can be obtained. In this way, if relative positions of the metal wiring 205 and the patterns 203L and 203R are the important factor in terms of optical design, it is desirable that their relative errors should be minimized. Thus, for example, an alignment mark may be provided on the metal wiring 205, and the exposure device may be aligned on the basis of the alignment mark when the patterns 203L and 203R are exposed. In this way, misalignment in relative positions of the metal wiring 205 and the patterns 203L and 203R decrease.

Sixth Embodiment

A divisional line in exposure in a joined fashion is not necessarily located at an optical axis of a microlens, i.e. at almost the center of one image pickup element, but may be located between adjacent image pickup elements.

Figure 7:
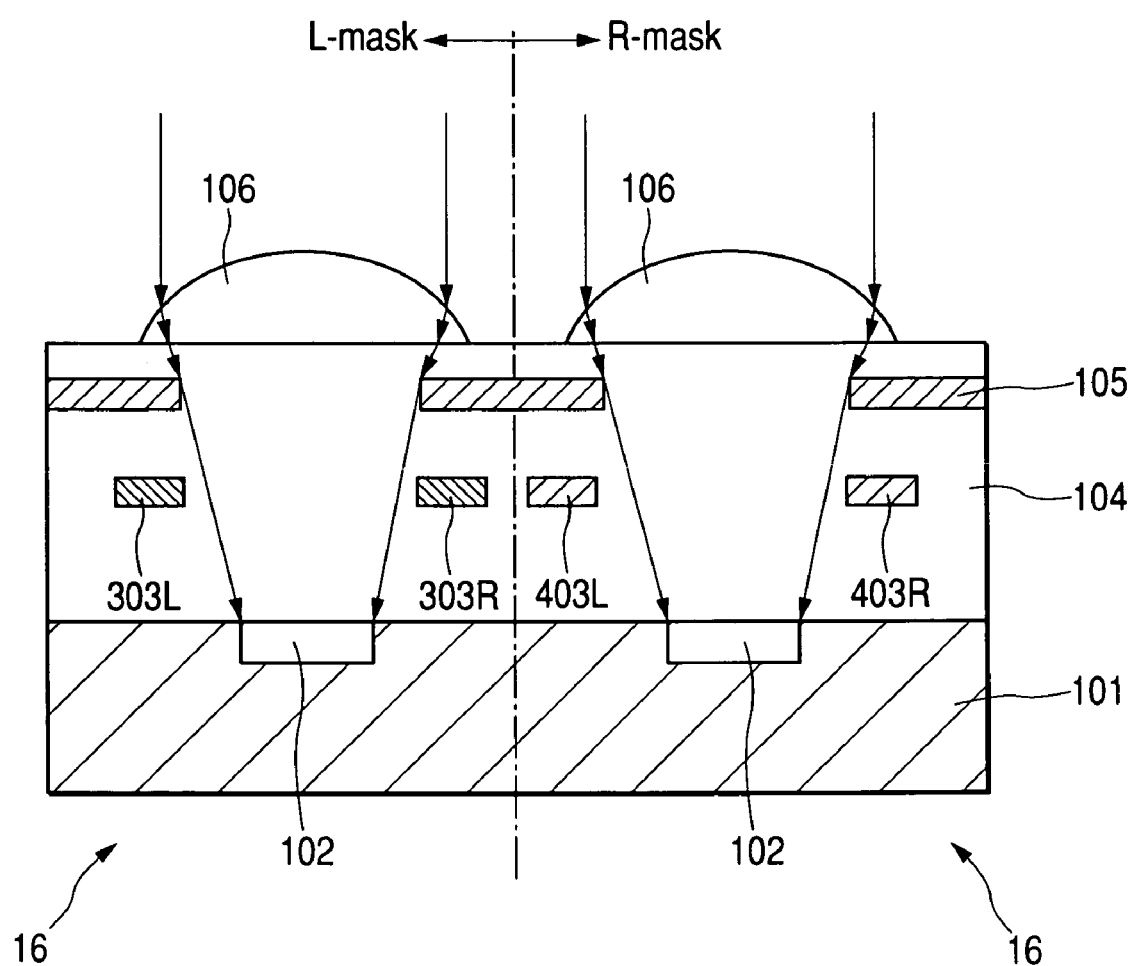
FIG. 7 is a sectional view showing the image pickup element of the sixth embodiment according to the present invention.

FIG. 7 shows a situation in which a divisional line is set at almost the center between adjacent image pickup elements 16, and exposure in a joined fashion is performed with the divisional line therebetween.

Even in this case, patterns 303L and 303R and patterns 403L and 403R are set so that a clearance from each corresponding optical path for incident light equals the distance L, whereby the optical path for incident light is never influenced by alignment accuracy of an exposure device.

Seventh Embodiment

Figure 8:
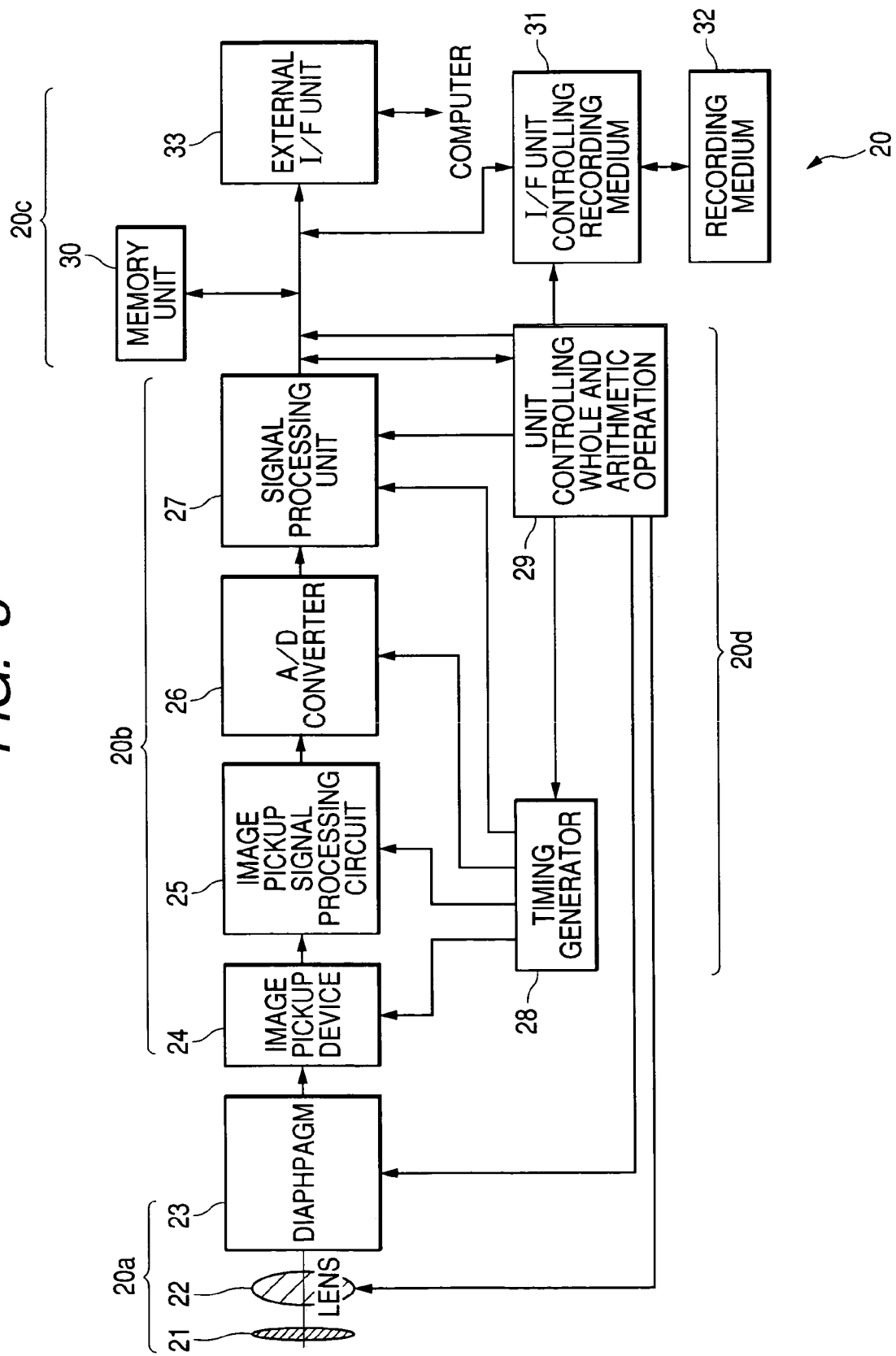
FIG. 8 is a block diagram of one embodiment of an image pickup system comprising the image pickup device according to the present invention.

FIG. 8 is a block diagram of one embodiment of an image pickup system using the image pickup device according to the embodiment of the present invention described above.

The image pickup system 20 shown in FIG. 8 is an image pickup system such as, for example, a still video camera, and is roughly comprised of an optical unit 20a for forming an image, a processing unit 20b photoelectrically converting the formed image and processing signals obtained thereby, a recording unit 20c in which data processed by the processing unit 20b is stored and so on, and a control unit 20d controlling drive of the units.

The optical unit 20a is comprised of a lens 22 forming an optical image of a subject, a barrier 21 protecting the lens 22 and also serving as a main switch and a diaphragm 23 making the light amount variable.

The processing unit 20b is comprised of an image pickup device 24 (e.g. image pickup device 1 described above) according to the present invention placed as an area sensor on the screen surface, an image pickup signal processing circuit 25 performing correction, clamp and the like of signals obtained by the image pickup device 24, an A/D converter 26 performing analog-digital conversion of signals outputted from the image pickup signal processing circuit 25, and a signal processing unit 27 correcting and compressing data outputted from the A/D converter 26.

The recording unit 20c is comprised of a memory unit 30 temporarily storing final data obtained by processing the data by the signal processing unit 27, an interface unit controlling recording medium 31, to which a predetermined recording medium 32 such as a semiconductor memory is removably connected and which is for recording data in and reading data from the recording medium 32, and an external interface unit 33 for communicating with an external computer and the like.

The control unit 20d controlling each unit comprises a timing generator 28 outputting timing signals to the image pickup device 24, the image pickup signal processing circuit 25, the A/D converter 26 and the signal processing unit 27, and a unit controlling whole and arithmetic operation 29 controlling the timing generator 28. The unit controlling whole and arithmetic operation 29 is configured to be capable of driving and controlling the lens 22, the diaphragm 23, the signal processing unit 27 and the recording unit 20c.

Operations of the image pickup system 20 configured as described above will be described below.

When the barrier 21 is opened, a main power supply is turned on, a power supply of a control system is then turned on, and a power supply of an image pickup system circuit such as the A/D converter 6 is turned on. The unit controlling whole and arithmetic operation 29 opens the diaphragm 23, and photoelectrically converts incident light incident through the lens 22, whereby a signal outputted from the image pickup device 24 is outputted through the image pickup signal processing circuit 5 to the A/D converter 26. The A/D converter 26 subjects the signal to A/D conversion and outputs the same to the signal processing unit 27. The signal processing unit 27 performs an arithmetic operation of exposure based on the data at the unit controlling whole and arithmetic operation 29. According to the result, the unit controlling whole and arithmetic operation 29 controls the diaphragm 23.

Then, based on the signal outputted from the image pickup device 24, high frequency components are taken out, and a distance from the subject image is calculated at the unit controlling whole and arithmetic operation 29. The unit controlling whole and arithmetic operation 29 drives the lens 22 based on the distance obtained by the calculation, determines whether focus is achieved or not, and drives the lens 22 again and calculates the distance if it determines that focus is not achieved.

The steps are repeated, and when it is determined that focus is achieved, main exposure is started. When exposure is completed, an image signal outputted from the image pickup device 24 is subjected to correction and the like at the image pickup processing circuit 25 and further subjected to A/D conversion by the A/D converter 26, passes through the signal processing unit 27 and is stored in the memory unit 30 by the unit controlling whole and arithmetic operation 29. In this way, data stored in the memory unit 30 passes through the interface unit controlling recording medium 31 and is stored in the recording medium 32 under control by the unit controlling whole and arithmetic operation 29. Alternatively, the stored data may be outputted through the external interface unit 33 directly to a computer or the like connected to the interface unit 33.

In the image pickup system 20 comprising the image pickup device 24 according to the present invention described above, uniform photoelectric conversion is performed among pixels (image pickup elements), and good image data having reduced variations can be obtained.

Exemplary embodiments have been described above, but components described in the embodiments may be used in combination where possible.

This application claims priority from Japanese Patent Application No. 2003-404544 filed Dec. 3, 2003, which is hereby incorporated by reference herein.

What is claimed is:

1. A solid state image pickup device comprising:
   a light receiving area disposed on a substrate;
   a plurality of layers disposed on a substrate;
   a light collecting unit disposed above the plurality of layers, wherein
   said plurality of layers include a layer having a first pattern formed by exposure in a plurality of steps, and a layer having a second pattern formed by one-shot exposure, the first and second patterns have openings corresponding to said light receiving area, the opening of the second pattern is larger than the opening of the first pattern, light collecting unit and the opening of the second pattern define an optical path of light incident in said light receiving area, first pattern is arranged in a position except for the optical path.

2. The solid state image pickup device according to claim 1, wherein the first pattern is formed between said second pattern and said light receiving area.

3. The solid state image pickup device according to claim 2, wherein a first insulation layer is formed between said light receiving area and the first pattern, and a second insulation layer having a refraction index smaller than said first insulation layer is formed between the first pattern and the second pattern.

4. The solid state image pickup device according to claim 1, wherein a further light collecting unit is formed between said light collecting unit and said light receiving area.

5. An image pickup system comprising:
   a processing unit comprising the solid state image pickup device according to any one of claims 1-4, and processing means for processing output signals from said solid state image pickup device and generating image data;
   a recording unit storing said image data;
   an optical unit forming a subject image on a screen surface of said solid state image pickup device; and
   a control unit controlling said processing unit, said recording unit and said optical unit.

* * * * *

UNITED STATES PATENT AND TRADEMARK OFFICE
CERTIFICATE OF CORRECTION

| | | |
|---|---|---|
| PATENT NO. | : 7,283,305 B2 | |
| APPLICATION NO. | : 10/991396 | |
| DATED | : October 16, 2007 | |
| INVENTOR(S) | : Akira Okita et al. | |

It is certified that error appears in the above-identified patent and that said Letters Patent is hereby corrected as shown below:

TITLE PAGE, ITEM [56] REFERENCES CITED

Foreign Patent Documents
"JP 8 321 595 A  12/1996" should read --JP 8-321595  12/1996--.

In the Drawings:
SHEET 3

Fig. 2A, "INAJOINED" should read --IN A JOINED--.

SHEET 10

Fig. 8, "DIAPHPAGM" should read --DIAPHRAGM--.

COLUMN 1

Line 10, "solid" should read --solid state--.
Line 11, "solid" should read --solid state--.

COLUMN 2

Lines 11-12, "the exposure device" should read --it--.
Line 13, "full area and" should read --full area of the exposure device, and the exposure device--.
Line 20, "5731131)." should read --5,731,131).--.
Line 48, "fined" should read --finer--.

COLUMN 3

Line 23, "into" should be deleted.

COLUMN 4

Line 7, "light" should read --light,--.

COLUMN 5

Line 64, "jointing" should read --joining--.

UNITED STATES PATENT AND TRADEMARK OFFICE
CERTIFICATE OF CORRECTION

PATENT NO. : 7,283,305 B2
APPLICATION NO. : 10/991396
DATED : October 16, 2007
INVENTOR(S) : Akira Okita et al.

It is certified that error appears in the above-identified patent and that said Letters Patent is hereby corrected as shown below:

<u>COLUMN 6</u>

Line 35, "not block" should read --not to block--.
Line 46, "patterns 103" should read --patterns 103L--.

<u>COLUMN 8</u>

Line 18, "invention, the" should read --invention. The--.

Signed and Sealed this

Eighteenth Day of November, 2008

JON W. DUDAS
*Director of the United States Patent and Trademark Office*